(12) United States Patent
Govindarajan

(10) Patent No.: US 7,316,962 B2
(45) Date of Patent: Jan. 8, 2008

(54) HIGH DIELECTRIC CONSTANT MATERIALS

(75) Inventor: Shrinivas Govindarajan, Niskayuna, NY (US)

(73) Assignee: Infineon Technologies AG, Munich (DE)

( * ) Notice: Subject to any disclaimer, the term of this patent is extended or adjusted under 35 U.S.C. 154(b) by 108 days.

(21) Appl. No.: 11/031,716

(22) Filed: Jan. 7, 2005

(65) Prior Publication Data

US 2006/0151823 A1 Jul. 13, 2006

(51) Int. Cl.
*H01L 21/20* (2006.01)

(52) U.S. Cl. ................ 438/396; 438/239; 438/253

(58) Field of Classification Search .......... 257/528; 438/396
See application file for complete search history.

(56) References Cited

U.S. PATENT DOCUMENTS

| | | | |
|---|---|---|---|
| 4,744,861 A * | 5/1988 | Matsunaga et al. | 438/593 |
| 4,884,123 A | 11/1989 | Dixit et al. | |
| 5,195,018 A * | 3/1993 | Kwon et al. | 361/313 |
| 5,510,173 A * | 4/1996 | Pass et al. | 428/216 |
| 5,523,624 A | 6/1996 | Chen et al. | |
| 6,022,798 A | 2/2000 | Sumi et al. | |
| 6,100,187 A | 8/2000 | Hintermaier et al. | |
| 6,181,498 B1 | 1/2001 | Kikuchi et al. | |
| 6,211,544 B1 | 4/2001 | Park et al. | |
| 6,222,218 B1 | 4/2001 | Jammy et al. | |
| 6,261,917 B1 | 7/2001 | Quek et al. | |
| 6,383,873 B1 | 5/2002 | Hegde et al. | |
| 6,407,435 B1 * | 6/2002 | Ma et al. | 257/411 |
| 6,451,664 B1 | 9/2002 | Barth et al. | |
| 6,485,828 B2 | 11/2002 | Agarwal | |
| 6,518,610 B2 | 2/2003 | Yang et al. | |
| 6,617,206 B1 | 9/2003 | Sandhu et al. | |
| 6,640,403 B2 | 11/2003 | Shih et al. | |
| 6,642,131 B2 | 11/2003 | Harada | |
| 6,646,298 B2 | 11/2003 | Rhodes | |
| 6,653,676 B2 | 11/2003 | Tsu et al. | |
| 6,667,669 B2 | 12/2003 | Goyette et al. | |
| 6,673,668 B2 | 1/2004 | Kim et al. | |
| 6,734,079 B2 * | 5/2004 | Huang et al. | 438/396 |
| 6,767,795 B2 | 7/2004 | Ahn et al. | |
| 6,783,997 B2 | 8/2004 | Rotondaro et al. | |
| 6,784,100 B2 | 8/2004 | Oh et al. | |

(Continued)

FOREIGN PATENT DOCUMENTS

CN 1458692 A 11/2003

(Continued)

OTHER PUBLICATIONS

Ng, Complete Guide to Semiconductor Devices, Second Edition, John Wiley & Sons: New York, 2002, p. 161.*

(Continued)

*Primary Examiner*—Carl Whitehead
*Assistant Examiner*—Colleen E. Rodgers
(74) *Attorney, Agent, or Firm*—Slater & Matsil, L.L.P.

(57) ABSTRACT

A capacitor (10) includes a substrate (12) and two metal electrodes (14, 18). A dielectric layer (16) is formed between the electrodes. Preferably, the dielectric layer has a dielectric constant greater than 25 and an adequate conduction band offset with silicon. Exemplary embodiments proposed use the following material systems: $Hf_uTi_vTa_wO_xN_y$, $Hf_uTi_vO_xN_y$, $Ti_uSr_vO_xN_y$, $Ti_uAl_vO_xN_y$ and $Hf_uSr_vO_xN_y$ (where u, v, w, x, and y are the atomic proportions of the elements in the dielectric stack).

24 Claims, 1 Drawing Sheet

U.S. PATENT DOCUMENTS

| | | |
|---|---|---|
| 6,787,429 B2 | 9/2004 | Lu et al. |
| 6,787,831 B2 | 9/2004 | Moon et al. |
| 6,794,262 B2 | 9/2004 | Ning et al. |
| 6,794,705 B2 | 9/2004 | Lian et al. |
| 6,797,562 B2 | 9/2004 | Bonart et al. |
| 6,812,091 B1 | 11/2004 | Gruening et al. |
| 6,828,192 B2 | 12/2004 | Gustin et al. |
| 7,064,043 B1 * | 6/2006 | Rouse ........................ 438/396 |
| 7,091,548 B2 * | 8/2006 | Jeong et al. ................. 257/310 |
| 2001/0039087 A1 | 11/2001 | Jammy et al. |
| 2002/0197789 A1 * | 12/2002 | Buchanan et al. ........... 438/240 |
| 2003/0006480 A1 * | 1/2003 | Lian et al. ................... 257/532 |
| 2003/0132469 A1 | 7/2003 | Moon et al. |
| 2003/0207532 A1 | 11/2003 | Chudzik et al. |
| 2004/0042155 A1 | 3/2004 | Ritter et al. |
| 2004/0043557 A1 | 3/2004 | Haukka et al. |
| 2004/0082126 A1 | 4/2004 | Park et al. |
| 2004/0097034 A1 | 5/2004 | Sandhu et al. |
| 2004/0104439 A1 | 6/2004 | Haukka et al. |
| 2004/0109280 A1 | 6/2004 | Moon et al. |
| 2004/0168627 A1 | 9/2004 | Conley, Jr. et al. |
| 2004/0171212 A1 | 9/2004 | Won et al. |
| 2004/0171280 A1 | 9/2004 | Conley, Jr. et al. |
| 2004/0224474 A1 | 11/2004 | Berth et al. |
| 2004/0238872 A1 | 12/2004 | Lee et al. |
| 2004/0262661 A1 | 12/2004 | Kim et al. |
| 2004/0262700 A1 | 12/2004 | Ahn et al. |
| 2004/0266217 A1 | 12/2004 | Kim et al. |
| 2005/0082586 A1 | 4/2005 | Tu et al. |
| 2005/0202659 A1 * | 9/2005 | Li et al. ..................... 438/533 |
| 2006/0088660 A1 * | 4/2006 | Putkonen et al. ......... 427/248.1 |
| 2006/0131675 A1 | 6/2006 | Wang et al. |
| 2006/0261516 A1 | 11/2006 | Kunitake et al. |

FOREIGN PATENT DOCUMENTS

| | | |
|---|---|---|
| WO | WO 99/31721 A1 | 6/1999 |
| WO | WO-02/31875 A2 | 4/2002 |
| WO | WO/2004/017377 A2 | 2/2004 |

OTHER PUBLICATIONS

Kim, H, et al., "Growth kinetics and initial stage growth during plasma-enhanced Ti atomic layer deposition," 2002 American Vacuum Society, J. Vac. Sci. Technol. A vol. 20, Issue 3, May/Jun. 2002, pp. 802-806.

Zhang, L. et al., "Effect of Pre-cooling Treatment on the Formation of C54 Phase Titanium Silicide," Mat. Res. Soc. Symp. Proc. vol. 670, 2001 Materials Research Society, pp. K3.7.1-K3.7.5.

Palermo, V., et al., "Lateral diffusion of titanium disilicide as a route to contacting hybrid Si/organic nanostructures," Applied Physics Letters, vol. 81, No. 19, Nov. 4, 2002, pp. 1-3.

Tsai W., et al., "Surface preparation and interfacial stability of high-k-dielectrics deposited by atomic layer chemical vapor deposition," Microelectronic Engineering, vol. 65, 2002 Elsevier Science B. V., pp. 259-272.

Beyers, R., et al., "Metastable phase formation in titanium-silicon thin films," J. Appl. Phys., vol. 57, No. 12, Jun. 15, 1985, pp. 5240-5245.

Robertson, J., "Band Structures and Band Offsets of High K Dielectrics on Si," Applied Surface Science, vol. 190, 2002, pp. 2-10.

Ino, T., et al., "Dielectric Constant Behavior of Hf-O-N System," Japanese Journal of Applied Physics, vol. 45, No. 4B, 2006, pp. 2908-2913.

* cited by examiner

HIGH DIELECTRIC CONSTANT MATERIALS

CROSS-REFERENCE TO RELATED APPLICATIONS

This application is related to the following co-pending applications, both of which are incorporated herein by reference: application Ser. No. 11/031,596, filed Jan. 7, 2005, and entitled "Method to Control Interfacial Properties for Capacitors Using a Metal Flash Layer" and application Ser. No. 11/031,691, filed Jan. 7, 2005, and entitled "DRAM with High K Dielectric Storage Capacitor and Method of Making the Same".

TECHNICAL FIELD

The present invention relates generally to semiconductor structures and methods, and more particularly to novel high dielectric constant materials.

BACKGROUND

Capacitors are elements used extensively in semiconductor devices for storing an electric charge. Capacitors essentially comprise two conductive plates separated by an insulator. The capacitance, or amount of charge held by the capacitor per applied voltage, is measured in farads and depends upon the area of the plates, the distance between them, and the dielectric value of the insulator. Capacitors are used in filters, in analog-to-digital converters, memory devices, and control applications, and many other types of semiconductor devices. For example, a dynamic random access memory (DRAM) cell includes a storage capacitor coupled in series with an access transistor. Data can be stored into and read out of the storage capacitor by passing charge through the access transistor and into the capacitor.

For DRAM capacitors, some key requirements for sub-70 nm technologies are low leakage current, low Equivalent Oxide Thickness (EOT), minimization of polysilicon depletion, adequate band offsets (for the dielectric), and thermal stability during subsequent processing. To achieve these requirements, the idea of using MIS (metal-insulator-silicon) or MIM (metal-insulator-metal) capacitors is known. A key challenge is to optimize the various interface properties and to use dielectrics with high capacitance. For applications involving gate electrodes, additional requirements include minimization of tunneling leakage current and gate resistance.

A number of high-dielectric constant materials are known for capacitors. Examples of high dielectric constant materials that have been proposed as capacitor dielectrics are tantalum pentoxide, titanium oxide, barium strontium titanate, and titanium oxide. To get a dielectric constant that is greater than 10, the prior art has focused on materials based on the $Hf_uAl_vSi_wO_xN_y$ or $La_uAl_vSi_wO_xN_y$ systems. These materials are limited to a maximum dielectric constant of around 30.

SUMMARY OF THE INVENTION

In one aspect, the present invention provides a dielectric layer with k greater than 25 and adequate conduction band offset with silicon. Exemplary embodiments proposed by this invention use the following material systems: $Hf_uTi_vTa_wO_xN_y$, $Hf_uTi_vO_xN_y$, $Ti_uSr_vO_xN_y$, $Ti_uAl_vO_xN_y$, and $Hf_uSr_vO_xN_y$ (where u, v, w, x, and y are the atomic proportions of the elements in the dielectric stack).

In a first embodiment, a method of forming a semiconductor device includes forming a first layer of a first material to a thickness of less than 10 nm. The first material has a dielectric constant greater than 30 (and preferably greater than about 50). A first layer of a second material is formed to a thickness of less than 10 nm. The second material having a band offset greater than 1.5 eV. Additional layers of the first and second material can then be formed in succession, resulting in a film with the targeted thickness. In one embodiment, the first material is $TiO_2$. The second material can be nitrides or oxides with a conduction band offset to Si, greater than ~1.5 eV, such as SrO, $Al_2O_3$, AlN, $HfO_2$, $Y_2O_3$, $Lan_2O_3$ (where Lan=Lanthanides such as Lanthanum, Praseodymium, Dysprosium, etc.), $Ta_2O_5$, $Sr_3N_2$, $Ta_3N_5$ and/or $Hf_3N_4$.

In another aspect, the present invention provides a capacitor that has a high capacity to store charge and a low leakage. In each case, the capacitor includes a dielectric sandwiched between two conductors. The capacitor can be used as a storage capacitor in a memory, as a capacitor in an analog or mixed signal application or a gate/gate dielectric/channel of a field effect transistor. In a first embodiment, the dielectric includes Hf, Ti, Ta, O, and N. In a second embodiment, the dielectric includes Hf, Ti, O, and N. In a third embodiment, the dielectric includes Ti, Sr, O, and N. In a fourth embodiment, the dielectric includes Ti, Al, O, and N. In a fifth embodiment, the dielectric includes Hf, Sr, O, and N.

The present invention includes a number of embodiments. In a first embodiment, a method of forming a semiconductor device includes depositing a layer of $Hf_3N_4$ over a substrate, depositing a layer of $HfO_2$ over the substrate, and depositing a layer of $TiO_2$ over the substrate. The layers of $Hf_3N_4$, $HfO_2$, and $TiO_2$ are part of a dielectric layer. In one embodiment, the layers of $Hf_3N_4$, $HfO_2$, and $TiO_2$ are deposited so as form a nanolaminate dielectric layer. The layers of $Hf_3N_4$, $HfO_2$, and $TiO_2$ can be annealed so as to form a mixed compound that includes Hf, Ti, O and N.

In another embodiment, a layer of $Ta_2O_5$ can be deposited over the substrate. In this case, the layers of $Hf_3N_4$, $HfO_2$, $TiO_2$, and $Ta_2O_5$ can be deposited so as form a nanolaminate dielectric layer. Alternatively, the layers of $Hf_3N_4$, $HfO_2$, $TiO_2$, and $Ta_2O_5$ can be annealed so as to form a mixed compound that includes Hf, Ti, Ta, O and N.

In one embodiment, the layer of $HfO_2$ is deposited after depositing the layer of $HF_3N_4$, the layer of $TiO_2$ is deposited after depositing the layer of $HfO_2$, and the layer of $Ta_2O_5$ is deposited after depositing the layer of $TiO_2$.

The layers of $Hf_3N_4$, $HfO_2$, $TiO_2$, and $Ta_2O_5$ can be part of a capacitor dielectric layer. As such, a conductor can be formed over the layers of $Hf_3N_4$, $HfO_2$, $TiO_2$, and $Ta_2O_5$.

In another embodiment, a method of forming a semiconductor device includes depositing a layer of $HfO_2$ over a substrate, depositing a layer of $TiO_2$ over the substrate, and depositing a layer of Ti over the substrate such that the layers of $HfO_2$, $TiO_2$ and Ti comprise a dielectric layer.

In another embodiment, a method of forming a semiconductor device includes depositing a layer of SrO over a substrate and depositing a layer of $TiO_2$ over the substrate, wherein the layers of SrO and $TiO_2$ comprise a dielectric layer. In one variation, the method includes depositing a second layer of SrO over the layers of SrO and $TiO_2$, depositing a second layer of $TiO_2$ over the layers of SrO and $TiO_2$, depositing a third layer of SrO over the layers of SrO and $TiO_2$ and the second layers of SrO and $TiO_2$; and depositing a third layer of $TiO_2$ over the layers of SrO and TiO$_2$ and the second layers of SrO and TiO$_2$. For example, the dielectric layer can be a nanolaminate dielectric layer. As another example, the layers of SrO and TiO$_2$ can be annealed so as to form a mixed compound that includes Ti, Sr, O and N.

In various aspects, the layer of SrO can be deposited over the layer of TiO$_2$, or vice versa. For example, the layer of SrO can be deposited to a thickness between 0.5 nm and 4 nm and the layer of TiO$_2$ can be deposited to a thickness between 0.5 nm and 4 nm. In another example, the layer of SrO is deposited to a thickness on the order of about 1 nm and the layer of TiO$_2$ can be deposited to a thickness on the order of about 1 nm.

In another embodiment, a method of forming a semiconductor device includes depositing a layer of Al$_2$O$_3$ over a substrate and depositing a layer of TiO$_2$ over the substrate. The layers of Al$_2$O$_3$ and TiO$_2$ are part of a dielectric layer. In a variation, the method further includes depositing a second layer of Al$_2$O$_3$ over the layers of Al$_2$O$_3$ and TiO$_2$, depositing a second layer of TiO$_2$ over the layers of Al$_2$O$_3$ and TiO$_2$, depositing a third layer of Al$_2$O$_3$ over the layers of Al$_2$O$_3$ and TiO$_2$ and the second layers of Al$_2$O$_3$ and TiO$_2$ and depositing a third layer of TiO$_2$ over the layers of Al$_2$O$_3$ and TiO$_2$ and the second layers of Al$_2$O$_3$ and TiO$_2$. For example, the dielectric layer can be a nanolaminate dielectric layer. A nitridation step can be performed so that the dielectric layer includes a nitrogen content. In another example, the layers of Al$_2$O$_3$ and TiO$_2$ can be annealed so as to form a mixed compound that includes Ti, Al, O and N.

The layer of Al$_2$O$_3$ can be deposited over the layer of TiO$_2$, or vice versa. In one example, the layer of Al$_2$O$_3$ is deposited to a thickness between 0.5 nm and 4 nm and the layer of TiO$_2$ is deposited to a thickness between 0.5 nm and 4 nm. In another example, the layer of Al$_2$O$_3$ is deposited to a thickness on the order of about 1 nm and the layer of TiO$_2$ is deposited to a thickness on the order of about 1 nm.

In another embodiment, a method of forming a semiconductor device includes depositing a layer of Hf$_3$N$_4$ over a substrate, depositing a layer of HfO$_2$ over the substrate, and depositing a layer of SrO over the substrate. The layers of Hf$_3$N$_4$, HfO$_2$, and SrO are part of a dielectric layer. The dielectric layer can be a nanolaminate dielectric layer or the layers of Hf$_3$N$_4$, HfO$_2$, and SrO can be annealed so as to form a mixed compound that includes Hf, Sr, O and N. In one example, the layer of HfO$_2$ is deposited after depositing the layer of Hf$_3$N$_4$ and the layer of SrO is deposited after depositing the layer of HfO$_2$. As with the other embodiments, the dielectric layer can a capacitor dielectric layer and a conductor can be formed over the dielectric layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a capacitor. The invention may also be applied, however, to other devices and structures that utilize dielectrics, particularly those dielectrics with a high dielectric constant. For example, a high dielectric constant material could be used as the gate dielectric in a field effect transistor.

In one aspect, the present invention identifies potential material systems that can meet the dielectric constant and other properties required to achieve low leakage and high capacitance. In the preferred embodiment, these material systems are based on TiO$_2$, which has a dielectric constant around 80 but has a very low conduction band offset (Ec) to silicon (<1.2 eV), and low band gap (E$_g$~3.5 eV). Candidates for combining with TiO$_2$ are: Ta$_2$O$_5$ (k=26, E$_c$<1.5 eV, Eg~4.5), Al$_2$O$_3$ (k=9, Ec=2.8 eV, Eg~8), HfO$_2$ (k=20, Ec=1.5 eV, Eg=5.8 eV), La$_2$O$_3$ (k=30, Ec=2.3 eV, Eg=4.3 eV), SrTiO$_3$ (k>100), Hf$_3$N$_4$ (k~30), and others. Combinations of these materials are also envisioned.

Figure 1:
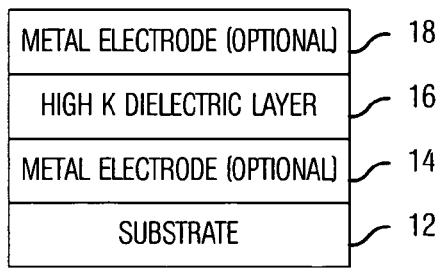
FIG. 1 provides a schematic showing a generic configuration of a capacitor (as deposited)

In the preferred embodiment, the individual components can be deposited by atomic layer deposition (ALD). Suitable precursors will be used for deposition of the various components (oxides, nitrides) listed above. For example, the possible sources for:

a. Oxygen—H$_2$, O$_2$ or O$_3$ b. Nitrogen—NH$_3$, N$_2$ c. Hafnium—metal alkyl amides (e.g., Tert ethyl methyl amino hafnium), metal halides (e.g., HfCl$_2$), metal alkoxides d. Titanium—metal halides (e.g., TiCl$_4$), metallorganics (e.g., TDMAT), metal alkoxides (e.g., Ti(OEt)$_4$)

e. Aluminum—metal alkyl amides (e.g., trimethyl aluminum), metal alkoxides.

f. Ta—metal alkyl amides (e.g., terbutylimidotris diethylamido tantalum or TBTDET), metallorganics, metal alkoxides.

g. Ru—metal cyclopentadienlyls (e.g., Ru(Cp)$_2$— biscyclopentadienyl ruthenium, Ru(ethylCp)$_2$)

h. Sr—metal cyclopentadienyls, metal alkyl amides, metal beta-diketonates, metal alkoxides FIG. 1 shows an example of the preferred embodiment of this invention. A capacitor 10 includes two conductors (i.e., substrate 12, electrode 14 and electrode 18) separated by a dielectric layer 16. In the illustrated embodiment, a bottom metal electrode layer 14 is included between the substrate 12 and the electrode 18. This layer can include a metal flash layer to clean up the interface. This flash layer can be any metal with high affinity for oxygen and a melting point (both for the metal and the oxide) above 1000° C. The metal electrode 14 could be formed from either pure metal (e.g., Ru, Hf, Ti, Ta . . . ), nitrides (e.g., TiN, TaN, HfN, mixtures of these) or carbo-nitrides (e.g., TiCN, NbCN, HfCN, TaCN . . . ). For example, TiN could be deposited by ALD using TiCl$_4$ and NH$_3$.

The substrate 12 can be an upper portion of a bulk silicon substrate or a silicon layer over another layer. As examples, the silicon layer 12 can be part of a silicon-on-insulator (SOI) substrate, an epitaxially grown layer over another layer (e.g., silicon over silicon germanium), or a silicon layer formed by a wafer bonding technique. The silicon layer could also be a layer formed over a substrate, e.g., a polysilicon layer used as a gate electrode or an electrode used in a stacked capacitor. Semiconductors other than silicon, e.g., germanium, silicon germanium, gallium arsenide and others, could alternatively be used. Alternatively, a non-semiconductor substrate 12 can be used. For example, the capacitor structure can be formed on a dielectric layer 12.

The embodiment depicted in FIG. 1 includes a metal layer 14 in direct contact with a silicon substrate 12. The metal layer 14 is optional. If included, the metal electrode layer can be deposited by atomic layer deposition using a thermal process or a suitable plasma-enhanced deposition process. Further details regarding the metal layer 14 is provided in co-pending application Ser. No. 11/031,596, which is incorporated herein by reference.

Another optional metal layer 18 is illustrated in FIG. 1. The top metal electrode 18 could be formed from either pure metal (e.g., Ru, Hf, Ti, Ta . . . ), nitrides (e.g., TiN, TaN, HfN, mixtures of these) or carbo-nitrides (e.g., TiCN, NbCN, HfCN, TaCN . . . ). For example, TiN could be deposited by ALD using $TiCl_4$ and $NH_3$.

Dielectric layer 16 is formed over the substrate 12 (and, in the illustrated embodiment, electrode 14 if included). In the preferred embodiment, the dielectric layer 16 is deposited by ALD of the individual components. Specific examples of materials are provided below. The thickness of this layer (typically, about 2 nm to about 20 nm), the thicknesses of the individual sub-layers, and the sequence of the layers is variable and depends on the capacitance enhancement to be achieved.

In a first embodiment, a nanolaminate is formed by sequential layers of a material that has a high dielectric constant and subsequent layers that have a high band offset (e.g., greater than about 1.5 to 2 eV). This combination of materials is preferred since a high dielectric constant material will retain charge and a high band offset will avoid leakage. For example, as discussed above, $TiO_2$ has an excellent dielectric constant of around 80, but the conduction band offset is quite low. Hence $TiO_2$ is not preferred by itself. Rather, this material is preferably combined with some material, which helps to increase the band offset. Two examples are described with respect to FIGS. 2 and 3.

Figure 2:
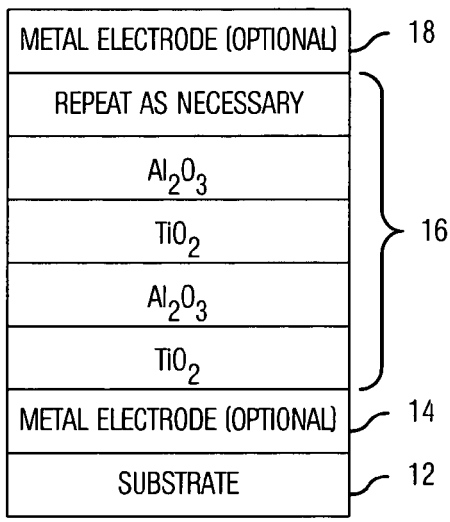
FIG. 2 illustrates an embodiment based on alternating layers of TiO$_2$ and Al$_2$O$_3$.
Figure 3:
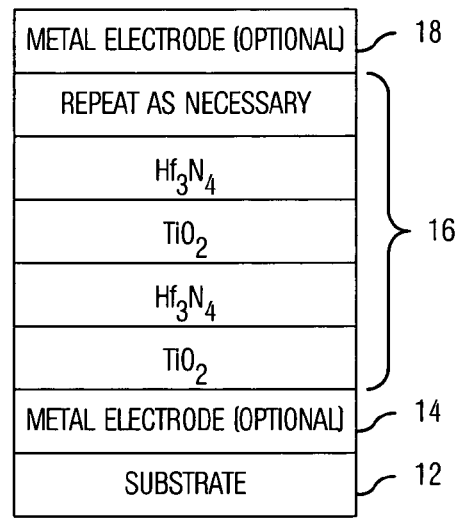
FIG. 3 illustrates an embodiment based on alternating layers of SrO and TiO$_2$.

A preferred embodiment comprises a nanolaminate of $TiO_2$ and $Al_2O_3$, as shown in FIG. 2, or $TiO_2$ and $Hf_3N_4$, as shown in FIG. 3. As will be discussed below, other materials could alternatively be used. In both of these figures, a layer of $TiO_2$ is deposited over the metal electrode 14, if included. The bottom electrode could either be formed from only the metal flash layer, a combination of the flash layer and a metal electrode, or a metal electrode only. The $TiO_2$ is typically very thin, e.g., less than 10 nm and preferably on the order of about 1 nm. In the embodiment of FIG. 2, a layer of $Al_2O_3$ is deposited over the $TiO_2$ layer and in the embodiment of FIG. 3, a layer of $Hf_3N_4$ is deposited over the $TiO_2$ layer. In either case, the newly deposited layer is about the same thickness as the $TiO_2$ layer. The nanolaminate stack is then built up by repeating the sequence of deposition (which can also be varied so as to change the overall composition of elements in the stack), until the target thickness is achieved. An alternative approach would be to start the nanolaminate structure with the material (e.g., $Al_2O_3$) which has the higher conduction band offset with silicon and, preferably, a higher band gap than the material with the higher dielectric constant, for example $TiO_2$. The structure can then be built up as described above.

After deposition of the dielectric layer, an optional RTP anneal/furnace anneal can be introduced. Preferably, the anneal is performed using a rapid thermal process (RTP) with a controlled atmosphere. Alternatively, a controlled furnace anneal could be utilized. In the RTP example, the structure can be heated to a temperature between about 400° C. and about 1100° C. for a time of about 10 to about 60 seconds. In the furnace anneal example, the structure can be heated to a temperature between about 400° C. and about 1000° C. for a time of about 5 to about 30 minutes.

After the optional anneal, an optional top metal electrode 18 can be deposited. The top metal electrode 18 could be formed from either pure metal (e.g., Ru, Hf, Ti, Ta . . . ), nitrides (e.g., TiN, TaN, HfN, mixtures of these) or carbo-nitrides (e.g., TiCN, NbCN, HfCN, TaCN . . . ). For example, TiN could be deposited by ALD using $TiCl_4$ and $NH_3$.

For nanolaminates, the individual layers (e.g., SrO, $Al_2O_3$, $TiO_2$, $Hf_3N_4$, AlN, $HfO_2$) are a few nm thick. In a preferred embodiment, the thickness is preferably about 0.5 nm to about 4 nm, typically about 1 nm. The layers are ideally intact as deposited. However, some intermixing/reactions can occur at the interfaces between each layer during a high temperature anneal.

In another embodiment, the dielectric 16 can be a mixed compound. In this case, thin layers are formed and then the structure is annealed to form, for example, a single compound. For mixed compounds, the individual layer thickness (as deposited) is typically less than 0.5 nm, to ensure a more homogenous film. After a high temperature anneal, the ideal scenario is that there is no crystallization of the film and that it does not separate into a few distinct compounds (which is possible, depending on the composition of the films). The typical approach, which could be used to predict what phases will be present after an anneal, is to use Quantum chemical calculations, molecular orbital theory and free energy minimization techniques. Since the exact details of the effect of an anneal on the mixed compounds is quite difficult to predict due to the fact that it may not be a completely stable, thermodynamic system, any implementation will require actual verification using a combination of techniques such as high resolution TEM, electron energy loss spectroscopy, Rutherford backscattering, X-ray photoelectron spectroscopy, or others. In any event, the present invention encompasses all phases from nanolaminate to mixed compound and in between.

In another embodiment, a method to form capacitors with low leakage and high capacitance involves a judicious mixing of oxides/nitrides/oxynitrides based on $TiO_2$ and perovskites such as $SrTiO_3$. Five exemplary systems are disclosed here. Each of these will be discussed now. These systems can be implemented as either a nanolaminate or a mixed compound.

A first system utilizes $Hf_u Ti_v Ta_w O_x N_y$. In the preferred embodiment, $0<u<60$, $0<v<60$, $0<w<60$, $0<x<50$, and $0<y<50$, and $u+v+w+x+y\sim100$. (It is recognized that some contaminants such as Cl, C, and H may be present, depending on the deposition process. These contaminants are ignored for purposes of determining the ratio of materials in the system). This embodiment includes all possible combinations of mixed oxides, nitrides and oxynitrides. For example, a mixed oxide can be formed by depositing alternating layers of $Hf_3N_4$, $HfO_2$, $TiO_2$, and $Ta_2O_5$. This can be converted to a nanolaminate structure by increasing the thickness of the sub-layers. The composition can be tailored by varying the number of cycles of each sub-layer.

As an example, a layer of $Hf_3N_4$ is deposited to a thickness of between about 0.5 nm and about 3 nm, preferably about 2 nm. Next a layer of $HfO_2$ is deposited to a thickness of between about 0.5 nm and about 3 nm, preferably about 2 nm. A layer of $TiO_2$ can be deposited to a thickness of between about 0.5 nm and about 3 nm, preferably about 2 nm. Finally, a layer of $Ta_2O_5$ can be deposited to a thickness of between about 0.5 nm and about 3 nm, preferably about 2 nm. These four layers can be repeated between about 1 and 10 times.

The sequence of deposition and the individual layer thickness' can also be changed to modify the properties of the ensuing dielectric stack. This would be the approach for forming a nanolaminate structure. The same group of binary mixtures can be processed in the form of mixed oxynitrides by reducing the layer thickness to 1 nm or less (preferably closer to a monolayer or about 0.5 nm thick). Another variation is to only use a subset of these binary mixtures. For example, $HfO_2$ and $TiO_2$ can be used to develop a $Hf_uTi_vO_x$ (which is the result of setting w and y equal to 0 in $Hf_uTi_vTa_wO_xN_y$). Once deposition of the dielectric stack is completed, subsequent processing can performed as described above.

A second example utilizes a $Hf_uTi_vO_xN_y$ system, including all possible combinations of mixed oxides, nitrides and oxynitrides. In the preferred embodiment, $0<u<60$, $0<v<60$, $0<x<50$, and $0<y<50$, and $u+v+x+y\sim100$ (some contaminants such as Cl, C, and H may be present, depending on the deposition process). For example, a mixed oxide can be formed by depositing alternating layers of $Hf_3N_4$, $HfO_2$, and $TiO_2$. This can be converted to a nanolaminate structure by increasing the thickness of the sub-layers. For example, a nanolaminate of $TiO_2$ and $HfO_2$ can be formed. Nitrogen can be incorporated in this structure by using an appropriate nitriding anneal (e.g., in a forming gas, $NH_3$ atmosphere, or $N_2$ atmosphere). The composition can be tailored by varying the number of cycles of each sub-layer.

Another option is to deposit $HfO_2$, $TiO_2$ and Ti layers. (This is an example where y is set equal to 0 in $Hf_uTi_vO_xN_y$.) The Ti content of the stack can then be independently controlled. The gettering effect of Ti can be used to control the oxygen content of the various oxides. For example, a first layer of Ti (e.g., 0.3 to 1 nm thick) can be deposited. This could be followed by a $HfO_2$ layer (0.3 to 1 nm thick). Another Ti layer can be deposited (e.g., 0.3 to 1 nm thick). A layer of $TiO_2$ can be deposited next (e.g., 0.3 to 1 nm thick). This sequence can be repeated to get a Ti-rich structure. Thicker layers of the binary mixtures (1 nm or greater) can be used to form nanolaminate structures. To reduce the Ti content, the Ti layer between $HfO_2$ and $TiO_2$ could be eliminated, for example. Alternatively, the relative thickness of the Ti layer can be increased with respect to the thickness of the $HfO_2$ or $TiO_2$ layers.

Another system utilizes $Ti_uSr_vO_xN_y$ and includes all possible combinations of mixed oxides, nitrides and oxynitrides. In the preferred embodiment, $0<u<60$, $0<v<60$, $0<x<50$, and $0<y<50$, and $u+v+x+y\sim100$ (some contaminants such as Cl, C, and H may be present, depending on the deposition process). For example, a mixed oxide can be formed by depositing alternating layers of SrO, $Sr_3N_2$ and $TiO_2$. This can be converted to a nanolaminate structure by increasing the thickness of the sub-layers. The composition can be tailored by varying the number of cycles of each sub-layer.

In the Atomic Layer Deposition (ALD) process, compound films are deposited by alternating the introduction of a precursor (e.g., $TiCl_4$, a possible source for Ti), purging the process chamber with an inert gas (say argon), introduction of the precursor/reactant containing the remaining component for the compound film (e.g., $NH_3$, a possible source for N), followed by a purge with inert gas (say argon) so as to evacuate the chamber. This consists of one ALD cycle. If the process parameters are optimized, ALD results in self-limiting growth, with the final thickness being a function of the number of ALD cycles. ALD can be used to generate nanolaminate or mixed oxynitrides by varying the sequence and number of cycles for the different binary mixtures, which are used to deposit the dielectric film. For example, 1 ALD cycle each of SrO, $Sr_3N_2$ and $TiO_2$ can be repeated until the desired thickness is attained. Alternatively, two cycles of SrO can be followed by 3 cycles of $Sr_3N_2$ and 1 cycle of $TiO_2$. Extending this approach, a variety of compositions can be formed and different settings for u, v, x and y generated.

Another approach would be to form a mixed oxide, e.g. by varying layers of $TiO_2$ and SrO. Once the $Ti_xSr_uO_x$ oxide is formed, nitrogen can be incorporated in this structure by using an appropriate nitriding anneal (e.g., in a forming gas, $NH_3$ atmosphere, or $N_2$ atmosphere). This anneal would be performed after completion of the mixed-oxide film deposition. An RTP anneal would be a preferred method, at temperatures between about 400° C. and 1000° C., for up to 60 seconds. Nitridation can also be achieved by using a furnace at temperatures between about 500° C. and 1100° C., for about 5 to about 30 minutes.

Another option is to deposit SrO, $TiO_2$ and Ti layers. The Ti content of the stack can then be independently controlled. The gettering effect of Ti can be used to control the oxygen content of the various oxides. The approach here is similar to that described above. For example, if ALD is used, one ALD cycle each of SrO, Ti and $TiO_2$ can be repeated until the desired thickness is attained. Alternatively, 2 cycles of SrO can be followed by 3 cycles of Ti and 1 cycle of $TiO_2$. Extending this approach, a variety of compositions can be formed and different settings for u, v, x and y generated.

Yet another system utilizes $Ti_uAl_vO_xN_y$, including all possible combinations of mixed oxides, nitrides and oxynitrides. In the preferred embodiment, $0<u<60$, $0<v<60$, $0<x<50$, and $0<y<50$, and $u+v+x+y\sim100$ (some contaminants such as Cl, C, and H may be present, depending on the deposition process). For example, a mixed oxide can be formed by depositing alternating layers of $Al_2O_3$, AlN, and $TiO_2$. This can be converted to a nanolaminate structure by increasing the thickness of the sub-layers. The ALD approach described above would once again apply to this embodiment.

Another approach would be to form a mixed oxide, e.g., by varying layers of $TiO_2$ and $Al_2O_3$. Once the $Ti_xAl_uO_x$ oxide is formed, nitrogen can be incorporated in this structure by using an appropriate nitriding anneal (e.g., in a forming gas, $NH_3$ atmosphere, or $N_2$ atmosphere). This anneal would be performed after completion of the mixed-oxide film deposition. An RTP anneal would be a preferred method, at temperatures between about 400° C. and 1000° C., for up to about 60 seconds. Nitridation can also be achieved by using a furnace at temperatures between about 500° C. and 1100° C., for about 5 to 30 minutes.

The final embodiment described here presents a $Hf_uSr_vO_xN_y$ system, including all possible combinations of mixed oxides, nitrides and oxynitrides. In the preferred embodiment, $0<u<60$, $0<v<60$, $0<x<50$, and $0<y<50$, and $u+v+x+y\sim100$ (some contaminants such as Cl, C, and H may be present, depending on the deposition process). For example, a mixed oxide can be formed by depositing alternating layers of HfO$_2$, SrO, Sr$_3$N$_2$, and/or Hf$_3$N$_4$. This can be converted to a nanolaminate structure by increasing the thickness of the sub-layers. The ALD approach described above can once again be utilized.

Another approach would be to form a mixed oxide, e.g., by varying layers of HfO$_2$ and SrO. Once the Hf$_x$Sr$_u$O$_x$ oxide is formed, nitrogen can be incorporated in this structure by using an appropriate nitriding anneal (e.g., in a forming gas, NH$_3$ atmosphere, or N$_2$ atmosphere). This anneal would be performed after completion of the mixed-oxide film deposition. An RTP anneal would be a preferred method, at temperatures between about 400° C. and 1000° C., for up to about 60 seconds. Nitridation can also be achieved by using a furnace at temperatures between about 500° C. and 1100° C., for about 5 to 30 minutes.

After an adequate film thickness of dielectric is deposited, the film can either be subjected to a high temperature anneal or sent on for deposition of the top metal electrode. If an anneal if performed, the preferred embodiment uses rapid thermal processing (RTP) with a controlled atmosphere. For example, the device could be heated at a temperature between about 400° C. and 1000° C. for a time between about 10 seconds and 60 seconds in an atmosphere of N$_2$, or NH$_3$. In an alternate embodiment, a controlled furnace anneal can be utilized. In an example of this embodiment, the device is heated at a temperature between about 500° C. and 1100° C. for a time between about 5 minutes and 30 minutes in an atmosphere of N$_2$ or NH$_3$.

After formation of the dielectric, a top electrode 18 can be formed. As discussed above, the top electrode 18 could be either pure metal (or metals), a conductive nitride, a carbonitride, or various combinations of these materials. The dielectric 16 between two conductors 18 and 12/14 forms a capacitor.

This structure can then be subjected to an anneal (RTP or furnace-based, with controlled oxygen and/or nitrogen partial pressures), if required. One alternative approach would be to omit the anneal and cap this structure with polycrystalline (or amorphous) silicon. Downstream anneals could accomplish the required film stabilization. Some nitrides, e.g., HfN, are extremely prone to oxidation and should be capped with a more stable film (e.g., TiN) prior to atmospheric exposure.

The dielectric of the present invention can be utilized in a number of applications. Examples of DRAM structures that can utilize this invention is described in co-pending application Ser. No. 11/031,691, which application is incorporated herein by reference. In another example. MIM (metal-insulator-metal) capacitors utilizing aspects of the present invention can be implemented in mixed signal and analog applications.

Figure 4:
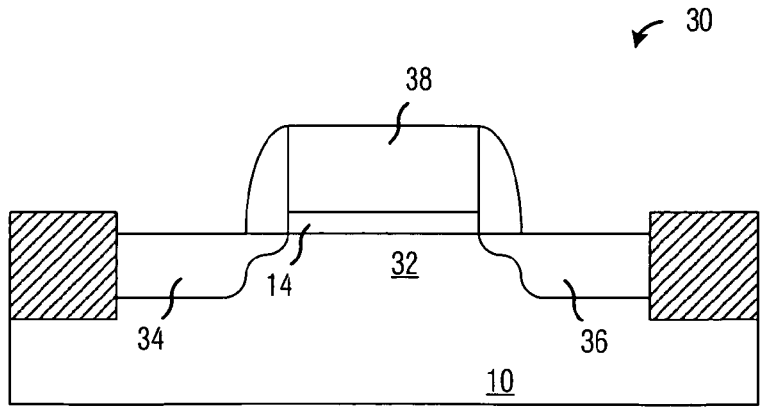
FIG. 4 is a cross-sectional view of a transistor with a gate dielectric of the present invention.

The dielectric of the present invention could also be used as a gate dielectric of a transistor. FIG. 4 illustrates a transistor 30 that can utilize aspects of the present invention. The transistor 30 includes a channel 32 formed in a semiconductor (e.g., monocrystalline silicon) body 10 between source/drain regions 34 and 36. Gate dielectric 14, which can be any of the dielectrics described herein, is formed over the channel layer. A gate electrode 38 is formed over the channel region, using known processing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications or embodiments.

What is claimed is:

1. A capacitor comprising:
   a first capacitor plate;
   a second capacitor plate; and
   a capacitor dielectric between the first capacitor plate and the second capacitor plate, the capacitor dielectric including a combination of materials, the combination selected from the group consisting of:
   (a) Hf$_u$Ti$_v$O$_x$N$_y$, wherein 0<u<60, 0<v<60, 0<x<50, 0<y<50, and u+v+x+y is essentially 100;
   (b) Hf$_u$Ti$_v$Ta$_w$O$_x$N$_y$, wherein 0<u<60, 0<v<60, 0<w<60, 0<x<50, 0<y<50, and u+v+w+x+y is essentially 100;
   (c) Ti$_u$Sr$_v$O$_x$N$_y$, wherein 0<u<60, 0<v<60, 0<x<50, 0<y<50, and u+v+x+y is essentially 100;
   (d) Ti$_u$Al$_v$O$_x$N$_y$, wherein 0<u<60, 0<v<60, 0<x<50, 0<y<50, and u+v+x+y is essentially 100; and
   (e) Hf$_u$Sr$_v$O$_x$N$_y$, wherein 0<u<60, 0<v<60, 0<x<50, 0<y<50, and u+v+x+y is essentially 100.

2. The capacitor of claim 1 wherein the first capacitor plate comprises a semiconductor material.

3. The capacitor of claim 2 wherein the first capacitor plate further comprises a metal.

4. The capacitor of claim 3 wherein the first capacitor plate comprises titanium silicide.

5. The capacitor of claim 1 wherein the first capacitor plate comprises a metal and the second capacitor plate comprises a metal.

6. The capacitor of claim 1 wherein the capacitor dielectric includes Hf, Ti, O and N.

7. The capacitor of claim 6 wherein the capacitor dielectric further includes Ta.

8. The capacitor of claim 1 wherein the capacitor dielectric includes Ti, Sr, O and N.

9. The capacitor of claim 1 wherein the capacitor dielectric includes Ti, Al, O and N.

10. The capacitor of claim 1 wherein the capacitor dielectric includes Hf, Sr, O and N.

11. A method of forming a semiconductor device, the method comprising:
    providing a semiconductor substrate;
    forming a first layer of a first material to a thickness of less than 10 nm over the semiconductor substrate, the first material having a dielectric constant greater than 30, wherein the first material comprises TiO$_2$;
    forming a second layer of a second material to a thickness of less than 10 nm over the semiconductor substrate, the second material having a conduction band offset to silicon greater than 1.5 eV;
    forming a third layer of the first material to a thickness of less than 10 nm over the semiconductor substrate;
    forming a fourth layer of the second material to a thickness of less than 10 nm over the semiconductor substrate, wherein the first, second, third and fourth layers are formed to create a dielectric from alternating layer of the first material and the second material, and wherein the second material comprises HfO$_2$; and
    forming a layer of a third material adjacent a layer of the first material or a layer of the second material, the third material comprising Hf$_3$N$_4$.

12. The method of claim 11 and further comprising forming a layer of a fourth material adjacent a layer of the first material or a layer of the second material, the fourth material comprising Ta$_2$O$_5$.

13. The method of claim 11 wherein the first layer of the first material is formed over a first conductor.

14. The method of claim 13 wherein the first layer of the first material is formed over a metal electrode that overlies the semiconductor substrate.

15. The method of claim 13 and further comprising forming a second conductor over the second layer of the second material, such that the first conductor forms a first plate of a capacitor and the second conductor forms a second plate of the capacitor.

16. The method of claim 11 wherein the first layer is formed before the second layer, the second layer is formed before the third layer, and the third layer is formed before the fourth layer.

17. The method of claim 11 further comprising annealing the first layer of first material, the third layer of first material, the second layer of second material and the second layer of second material.

18. The method of claim 17 wherein the anneal forms a mixed compound of the first material and the second material.

19. A method of forming a semiconductor device, the method comprising:
providing a semiconductor substrate;
forming a first layer of a first material to a thickness of less than 10 nm over the semiconductor substrate, the first material having a dielectric constant greater than 30, wherein the first material comprises $TiO_2$;
forming a second layer of a second material to a thickness of less than 10 nm over the semiconductor substrate, the second material having a conduction band offset to silicon greater than 1.5 eV; wherein the second material comprises $Hf_3N_4$;
forming a third layer of the first material to a thickness of less than 10 nm over the semiconductor substrate; and
forming a fourth layer of the second material to a thickness of less than 10 nm over the semiconductor substrate, and
wherein the first, second, third and fourth layers are formed to create a dielectric from alternating layers of the first material and the second material.

20. The method of claim 19 further comprising forming a layer of a fourth material adjacent a layer of the first material or a layer of the second material, the fourth material comprising $Ta_2O_5$.

21. A method of forming a semiconductor device, the method comprising:
providing a semiconductor substrate;
forming a first layer of a first material to a thickness of less than 10 nm over the semiconductor substrate, the first material having a dielectric constant greater than 30, wherein the first material comprises $TiO_2$;
forming a second layer of a second material to a thickness of less than 10 nm over the semiconductor substrate, the second material having a conduction band offset to silicon greater than 1.5 eV;
forming a third layer of the first material to a thickness of less than 10 nm over the semiconductor substrate;
forming a fourth layer of the second material to a thickness of less than 10 nm over the semiconductor substrate, wherein the first, second, third and fourth layers are formed to create a dielectric from alternating layers of the first material and the second material; and
forming a layer of a third material adjacent a layer of the first material or a layer of the second material, the third material comprising $Hf_3N_4$.

22. The method of claim 21 wherein the second material comprises SrO.

23. The method of claim 21 wherein the second material comprises $Al_2O_3$.

24. The method of claim 21 wherein the second material comprises $HfO_2$.

* * * * *

UNITED STATES PATENT AND TRADEMARK OFFICE
CERTIFICATE OF CORRECTION

PATENT NO.       : 7,316,962 B2  
APPLICATION NO.  : 11/031716  
DATED            : January 8, 2008  
INVENTOR(S)      : Govindarajan Page 1 of 1

It is certified that error appears in the above-identified patent and that said Letters Patent is hereby corrected as shown below:

On the Title Page, Section (56) References Cited, U.S. PATENT DOCUMENTS, Page 1, column 2, $2^{nd}$ entry, delete "6,485,828 B2    11/2002" and insert --6,465,828 B2 10/2002--.
On the Title Page, Section (56) References Cited, U.S. PATENT DOCUMENTS, Page 2, column 1, $24^{th}$ entry, delete "Berth" and insert --Barth--.
In Col. 1, line 37, delete "charge" and insert --a charge--.
In Col. 1, line 67, delete "$O_xN_y$ $Hf_uTi_vO_xN_y$," and insert --$O_xN_y$, $Hf_uTi_vO_xN_y$,--.
In Col. 2, line 37, after "as" insert --to--.
In Col. 2, line 42, after "as" insert --to--.
In Col. 2, line 47, delete "$HF_3N_4$" and insert --$Hf_3N_4$--.
In Col. 3, line 50, after "can" insert --be--.
In Col. 7, line 12, delete "thickness'" and insert --thickness--.
In Col. 7, line 22, after "can" insert --be--.
In Col. 9, line 47, delete "is" and insert --are--.
In Col. 10, line 15, delete "$Ti_uSr_vO_xN_y$," and insert --$Ti_uSr_vO_xN_y$,--.
In Col. 10, line 56, delete "layer" and insert --layers--.
In Col. 11, line 15, delete "second" and insert --fourth--. (3rd occurrence)

Signed and Sealed this

Twenty-sixth Day of August, 2008

JON W. DUDAS  
*Director of the United States Patent and Trademark Office*